United States Patent [19]
Ogawa

[11] Patent Number: 5,313,168

[45] Date of Patent: May 17, 1994

[54] APPARATUS FOR DETECTING FUEL DIELECTRIC CONSTANT

[75] Inventor: Kenji Ogawa, Hyogo, Japan

[73] Assignee: Mitsubishi Denki Kabushiki Kaisha, Tokyo, Japan

[21] Appl. No.: 972,852

[22] Filed: Nov. 6, 1992

[30] Foreign Application Priority Data

Nov. 6, 1991 [JP] Japan ................................. 3-289778
Nov. 6, 1991 [JP] Japan ................................. 3-289844

[51] Int. Cl.$^5$ ........................................... G01R 27/26
[52] U.S. Cl. ................................. 324/663; 73/61.43; 324/683; 324/682
[58] Field of Search ............... 324/663, 667, 668, 681, 324/682, 683; 73/61.43, 61.44; 307/511; 328/133; 331/65

[56] References Cited

U.S. PATENT DOCUMENTS

| | | | |
|---|---|---|---|
| 3,443,218 | 5/1969 | Jaggers et al. | 324/683 |
| 4,228,393 | 10/1980 | Pile | 331/65 |
| 4,272,718 | 6/1981 | Kashinchi | 324/668 |
| 4,470,300 | 9/1984 | Kobayashi | 73/61.43 |
| 4,629,914 | 12/1986 | Okanobu | 307/511 |
| 4,675,596 | 6/1987 | Smith | 324/683 |
| 5,014,011 | 5/1991 | Colvin | 324/663 |
| 5,099,202 | 3/1992 | Claydon et al. | 307/511 |
| 5,122,678 | 6/1992 | Takeyama | 307/511 |

FOREIGN PATENT DOCUMENTS

| | | | |
|---|---|---|---|
| 0163873 | 10/1982 | Japan | 324/668 |
| 404151568 | 5/1992 | Japan | 324/663 |
| 404262250 | 9/1992 | Japan | 324/686 |

Primary Examiner—Michael J. Tokar
Assistant Examiner—Maura Regan
Attorney, Agent, or Firm—Sughrue, Mion, Zinn, Macpeak & Seas

[57] ABSTRACT

In a fuel dielectric constant detecting apparatus, a high frequency signal is applied to an element for subjecting the high frequency voltage signal to resonance corresponding to the dielectric constant of the fuel. A DC voltage is applied to the subjecting element so that the duty of the high frequency signal be 50%, and the high frequency signals are so controlled that the phase shift between the signals provided at both ends of the resistor be a predetermined value. Alternatively, in the apparatus, the high frequency signal applying member includes a high frequency signal applying section and a reference high frequency signal applying section. The frequencies to the subjecting element are so controlled that the phase shift between the high frequency signal at the connecting point of the resistor and the subjecting element and the reference high frequency signal be equal to a phase shift between the high frequency signal applied to the subjecting element through the resistor and the reference high frequency signal, and those frequencies thus controlled or amounts of control for determining the latter are utilized to detect the dielectric constant of the fuel.

8 Claims, 10 Drawing Sheets a : GASOLINE
b : METHANOL

APPARATUS FOR DETECTING FUEL DIELECTRIC CONSTANT

BACKGROUND OF THE INVENTION

This invention relates to an apparatus for detecting fuel dielectric constant which detects the dielectric constant of a fuel in a non-contact mode which is supplied to a burner or the like to determine the properties of the fuel, and more particularly relating to an apparatus to detect fuel dielectric constant for measuring the content of alcohol in a fuel used for the engine of a motor vehicle or the like.

Recently, in the United States of America and in many countries in Europe, in order to decrease the consumption of oil and to reduce the air pollution due to the exhaust gas of motor vehicles, a fuel prepared by mixing alcohol with gasoline is being introduced for motor vehicles. However, in case of using the alcohol-mixed fuel to the engine which is adjusted an air/fuel ratio to match with a gasoline fuel, since alcohol is smaller in theoretical air/fuel ratio than gasoline, the air/fuel ratio is leaned, which makes it difficult to smoothly operate the engine. In order to eliminate this difficulty, the following method has been employed: The content of alcohol in the alcohol-mixed fuel is detected, and the air/fuel ratio and the ignition timing are adjusted according to the content of alcohol thus detected.

In order to detect the content of alcohol, there have been proposed a method in which the dielectric constant of an alcohol-mixed fuel is detected, and a method in which the refractive index of the same is detected. With respect to the former method, the present Applicant has proposed a "dielectric constant detecting apparatus" under Japanese Patent Application No. 22488/1991.

The dielectric constant detecting apparatus thus proposed will be described with reference to FIG. 5.

In FIG. 5, a sensor section A is provided. And a bottomed cylindrical insulating tube 1 is made of an insulating material such as ceramic or oil-resisting plastics into which a fuel is led. An electrically conductive electrode 3 in the form of a cylinder is provided inside the insulating tube 1 in such a manner that it is coaxial with the insulating tube 1 with its outer cylindrical surface being substantially in parallel with the inner cylindrical surface of the insulating tube 1. A single layer coil 4 is wound on the insulating tube 1 in such a manner as to confront with the electrically conductive electrode 3. The lead wires 4a and 4b are provided to the single layer coil 4. A fuel passageway 2 is defined by the inner cylindrical surface of the single layer coil 4 which contacts with the insulating tube 1 and the outer cylindrical surface of the electrode 3. A flange 5 is provided with the electrode 3, and is coupled to the insulating tube 1 through a fuel seal 7 so as to form a fuel container (in this case, the flange 3 being integral with the electrode 3). Nipples 6 lead the fuel to the fuel passageway 2. A detecting circuit section B.

The detecting circuit section B comprises: a series resistor 10 (whose resistance being $R_s$) connected in series to the lead wire 4a of the single layer coil 4; a 0° phase comparator connected in parallel to the resistor 10; a low-pass filter connected to the output of the phase comparator 14; a comparison integrator 16 which is connected to the output of the low-pass filter 15 and to which a predetermined reference voltage $V_{ref}$ corresponding to a phase shift 0° is applied; a voltage-controlled oscillator 17 connected to the output of the comparison integrator 16; an amplifier 18 for amplifying the output of the voltage-controlled oscillator 17; and a frequency divider 19 adapted to frequency-divide the output of the voltage-controlled oscillator 17.

The operation of the above conventional apparatus to detect dielectric constant will be described.

The sensor section A is arranged as shown in FIGS. 4(a) and 4(b). In FIGS. 4(a) and 4(b), the inductance L of the single layer coil 4 is contained. The capacitance $C_f$ between the single layer coil 4 and the electrically conductive electrode 3 changes according to a change of the dielectric constant $\epsilon$ of the fuel in the fuel passageway 2. And a capacitance $C_p$ is as a stray capacitance of the lead wire 4a, an input capacitance of the phase comparator 11 and the like, which is not effected by the dielectric constant $\epsilon$.

Hereupon, when the frequency applied to the lead 4a of the sensor section A is changed, a parallel LC resonance occurs as shown in FIG. 4(c). In this case, the parallel resonance frequency $f_r$ can be calculated according to the following Equation (1):

$$f_r = 1/(2\pi \sqrt{(L \times (C_p + C_s))}) = K/\sqrt{(a + b \times \epsilon)} \qquad (1)$$

where K, a and b are the constants which are determined according to the configuration of the sensor section A. As is seen from Equation (1), the resonance frequency $f_r$ depends on the dielectric constant $\epsilon$ of the fuel; that is, as the dielectric constant $\epsilon$ increases, the resonance frequency $f_r$ is decreased.

The resonance frequency $f_r$ of a concrete example of the sensor section having a predetermined configuration was measured as follows: In the case where the fuel was methanol having a dielectric constant $\epsilon=33$, the resonance frequency $f_r$ was 7.5 MHz; and in the case where it was gasoline having a dielectric constant $\epsilon=2$, the resonance frequency was about 9.5 MHz. In the case where a fuel was prepared by mixing methanol and gasoline in an optional mixing ratio, the resonance frequency $f_r$ changed according to the content of methanol as shown in FIG. 4(d). Hence, by detecting a signal corresponding to the resonance frequency $f_r$, the dielectric constant $\epsilon$ of the fuel, and accordingly the content of methanol in the methanol-mixed fuel can be detected.

The detecting circuit section B, designed to detect the resonance frequency $f_r$, operates as follows:

With a methanol-mixed fuel in the fuel passageway 2, the amplifier 18 applies a high frequency signal to a series circuit of the resistor 10 and the single layer coil 4. The voltage signal across the resistor 10; i.e., a high frequency voltage signal applied to the series circuit, and a high frequency voltage signal applied to the single layer coil 4 are applied to the phase comparator 14, where their phases are compared with each other.

It is assumed that the frequency of the high frequency voltage signal applied to the series circuit is equal to the resonance frequency $f_r$. In this case, as shown in FIG. 4(c), the current voltage phase of the sensor section A is 0°, and therefore the phase shift between the high frequency voltage signals provided at both ends of the resistor 10 is also 0°. When, on the other hand, a high frequency voltage signal whose frequency is lower than the resonance frequency $f_r$, as shown in FIG. 4(c) the current voltage phase of the sensor section A leads 0°, and therefore with the phase of the high frequency signal applied to the series circuit as a reference, the phase shift between the high frequency voltage signals provided at both ends of the resistor 10 is larger than 0°.

Thus, a phase synchronization loop is established in which the output of the phase comparator 14 is converted into a DC voltage corresponding to the phase shift with the aid of the low-pass filter 15; this DC voltage and the DC voltage $V_{ref}$ corresponding to a phase shift 0° are applied to the comparison integrator 16, where a difference between the phase shifts is subjected to integration; and the output of the comparison integrator 16 is applied to the voltage-controlled oscillator 17 which applies the high frequency signal through the resistor 10 to the above-described series circuit.

With the phase synchronization loop thus established, the voltage-controlled oscillator 17 is so operated that the phase shift between the high frequency voltage signals at both ends of the resistor 10 be 0°, and the oscillator 17 oscillates at the resonance frequency $f_r$ at all times. The frequency divider 19 subjects the output frequency of the voltage-controlled oscillator to frequency division to provide a frequency output $f_{out}$. Since the oscillation frequency of the voltage-controlled oscillator 17 corresponds to the control input voltage in a ratio of 1:1, the output of the comparison integrator 16 can be used as a voltage output $V_{out}$.

The conventional dielectric constant detecting apparatus will be described more concretely with reference to FIGS. 6 and 7. As shown in FIG. 6, the phase comparator 14 includes an EXCLUSIVE OR circuit 14c, and the phase synchronization loop is so formed that the phase shift between the high frequency voltage signals at both ends of the resistor 10 be 0°. FIG. 7 shows signals P1 through P6 at various circuit points in FIG. 6. The signal P1, or a high frequency square wave signal P1 outputted by the voltage-controlled oscillator 17 is applied to the CK port of a first D flip-flop circuit 18 in the amplifier 18, and it is further applied through an inverter 18c to the CK portion of a second D flip-flop circuit 18b with its phase inverted A signal at the inversion output port of the first D flip-flop circuit 18a is applied to the D port of the second D flip-flop circuit 18b, and a signal at the inversion output port of the second D flip-flop circuit 18b is applied to the D portion of the first flip-flop circuit 18a. The signal P2 is provided at the output port Q of the first D flip-flop circuit 18a, being the high frequency signal applied to the single layer coil 4 through the resistor 10. The signal P2 is changed in level at the rise of the high frequency square wave signal P1; that is, the signal P2 corresponds to a signal obtained by subjecting the signal P1 to ½ signal frequency division. The signal P2 is applied through an inverter 14a to the EXCLUSIVE OR circuit 14c. On the other hand, the signal P3 is provided at the output port Q of the second D flip-flop circuit 18b, and it is changed in level at the fall of the signal P1; that is, the signal P3 is equal in frequency to the signal P2 and different by 90° in phase from the latter P2.

The signal P4 is provided in the connecting line between the resistor 10 and the single layer coil 4 so that it is applied to the latter 4. The signal P4 is further applied to one input terminal of the EXCLUSIVE OR circuit 14c, while the signal P3 is applied through an inverter 14b to the other input terminal with its phase inverted, so that those signals are subjected to phase comparison. The high frequency signal P4 provided in the connecting line between the resistor 10 and the single layer coil 4 is sinusoidal as shown in FIG. 7. There-fore, the DC level of the signal P4 is adjusted to the threshold level of the inverter 14a by an operational amplifier 20 with the aid of a variable resistor 21; that is, the sinusoidal signal P4 is shaped into the signal P5 which is a square wave.

At the frequency at which the LC circuit of the sensor section A resonates, the output square wave P4 of the inverter 14a is opposite in phase to the square wave P2 applied to the resistor 10, and its phase is shifted by 90° from that of the signal P3 at the output port Q of the second flip-flop circuit 18b. Therefore, when the phase shift between the signals P2 and P4 at both ends of the resistor 10 is 0°; that is, when the frequency provided is the one at which the LC circuit of the sensor section A resonates, the output of the EXCLUSIVE OR circuit 14c, namely, the signal P6 is a square wave having a duty of 50%. When the frequency is other than the resonance frequency, the duty of the signal P is smaller than or larger than 50%. That is, the square wave provided by the EXCLUSIVE OR circuit has the duty corresponding to the phase shift between the signals P2 and P4 in a ratio of 1:1.

The output signal P6 of the EXCLUSIVE OR circuit 14c is applied to the low-pass filter 15, the DC output of which corresponds to the phase shift between the high frequency voltage signals P2 and P4 at both ends of the resistor 10 in a ratio of 1:1. The output of the low-pass filter 15 is applied to the comparison integrator 16, where the shift between it (the output) and the voltage $V_{ref}$ is subjected to integration. It should be noted that the voltage $V_{ref}$ has been so adjusted with a variable resistor 22 that it is equal to the DC level which the low-pass filter 15 outputs when the phase shift between the signals P2 and P4 at both ends of the resistor 10 is 0°. The resultant integration value; i.e., the output of the comparison integrator is applied to the voltage-controlled oscillator 17 to control the oscillation frequency.

That is, the phase synchronization loop formed controls the output frequency of the voltage-controlled oscillator 17 so that the phase shift between the high frequency voltage signals at both ends of the resistor 10 be 0. Hence, the frequency output $f_{out}$ which is obtained by frequency-dividing the output frequency of the voltage-controlled oscillator 17 is a function which decreases monotonically with respect to the fuel dielectric constant $\epsilon$ shown in FIG. 4; i.e., the methanol content. The output of the comparison integrator applied to the voltage-controlled oscillator 17 is outputted as a voltage output $V_{out}$.

The conventional dielectric constant detecting apparatus thus organized is disadvantageous in the following points:

When the fuel dielectric constant changes abruptly so that the phase synchronization loop becomes unsatisfactory in control, the signals P2 and P4 become different in phase, and the impedance of the LC resonance circuit is decreased as shown in FIG. 4, and the threshold level of the inverter 14a adapted to shape the waveform of the sinusoidal high frequency signal P4 differs somewhat from the DC level which is applied to the single layer coil 4 with the aid of the operational amplifier 20 and the variable resistor 21. Hence, as shown in FIG. 8, the signal P4 no longer crosses the threshold level, as a result of which no waveform shaping operation is carried out as indicated at P5 in FIG. 8.

In this case, the output P6 of the phase comparator 14 is a signal having a duty of 50% which is obtained merely by inverting the signal P3, and the output of the low-pass filter 15 is the same as that which is provided when control is made by the phase synchronization loop. As a result, the phase synchronization fails in control, so that a value different from the true fuel dielectric constant is outputted.

In the case where the conventional fuel dielectric constant detecting apparatus is manufactured on mass-production, the DC levels to be applied to the single layer coils 4 must be adjusted individually according to the threshold levels of the inverters 14a.

Furthermore, when the duty of the output of the voltage-controlled oscillator 17 is not 50%, or the supply voltage applied to the detecting circuit B changes, the high level voltage of the EXCLUSIVE OR circuit 14c is changed, and the output of the low-pass filter 15 is changed which is the DC signal corresponding to the phase shift between the voltage signals at both ends of the resistor 10, so that, when the phase shift is 0°, the DC level voltage is changed. This means that the aimed phase shift of the phase synchronization loop is shifted from 0°. That is, as shown in FIG. 9, a frequency $f_0$ should be outputted; however, a frequency $f_1$ is outputted because the aimed phase shift is shifted as was described above. On the other hand, as the fuel dielectric constant changes, the resonance is changed in quality factor Q. For instance, as indicated by the two-dot chain lines in FIG. 9, the phase curve becomes gentle in inclination with the quality factor Q decreased, and a frequency $f_2$ is outputted. In this case, the detection is low in accuracy, and affected by the fuel conductivity.

In a mass production of the conventional dielectric constant detecting apparatus, for each comparison integrator 16 the voltage $V_{ref}$ must be adjusted according to the duty of the output of the voltage-controlled oscillator 17. This will lower the manufacturing efficiency.

SUMMARY OF THE INVENTION

Accordingly, this invention is attained to eliminate the above-described difficulties accompanying a conventional fuel dielectric constant detecting apparatus.

More specifically, an object of the invention is to provide a fuel dielectric constant detecting apparatus which, with the aimed phase shift of the phase synchronization loop set to 0°, detects a fuel dielectric constant with a normal output duty under correct control conditions, and which is suitable for mass production.

According to one aspect of this invention, there is provided an apparatus for detecting the dielectric constant of a fuel, which comprises: high frequency applying means for applying a square wave high frequency through a resistor to a detecting coil; a waveform shaper which receives a signal provided in the connecting line between the detecting coil and compares it with a predetermined comparison level to output a square wave; a phase comparator for detecting the phase shift between the output of the high frequency applying means and the output of the waveform shaper; control means for controlling the output frequency of the high frequency applying mens so that the output of the phase comparator be a predetermined value; duty detecting means for detecting the duty of the output of the waveform shaper; and bias control means for applying a DC voltage to the other terminal of the detecting coil so that the output of the duty detecting means be a predetermined value.

In the apparatus, the duty of the output of the waveform shaper is detected which is adapted to shape the waveform of the sinusoidal high frequency voltage signal developed at the connecting line between the detecting coil and the resistor, and the DC voltage is applied to the detecting coil so that the output duty may be a predetermined value.

According to another aspect of the invention, there is provided an apparatus for detecting the dielectric constant of a fuel, which comprises: high frequency applying means for applying a high frequency through a resistor to a detecting coil; reference high frequency generating means for outputting a high frequency which is shifted in phase from the output of the high frequency applying means as much as a predetermined angle; a detecting phase comparator for detecting the phase shift between a high frequency signal provided in the connecting line of the detecting coil and the resistor and the output of the reference high frequency generating means; a reference phase comparator for detecting the phase shift between the output of the high frequency applying means and the output of the reference high frequency generating means; and control means for controlling the output frequencies of the high frequency applying means and the reference high frequency generating means so that the output of the detecting phase comparator is equal to the output of the reference phase comparator.

In the apparatus, the output frequencies of the high frequency applying means and the reference high frequency generating means are so controlled that the phase shift between the high frequency signal provided in the connecting line of the resistor and the detecting coil and the reference high frequency signal be equal to the phase shift between the output of the high frequency applying means and the reference high frequency signal, and therefore the signals provided at both ends of the resistor are in phase with each other.

The nature, principle, and utility of the invention will be more clearly understood from the following detailed description of the invention when read in conjunction with the accompanying drawings.

DETAILED DESCRIPTION OF THE PREFERRED EMBODIMENTS

Preferred embodiments of this invention will be described with reference to the accompanying drawings.

A dielectric constant detecting apparatus, a first embodiment of the invention, will be described with reference to FIGS. 1 and 2.

Figure 1:
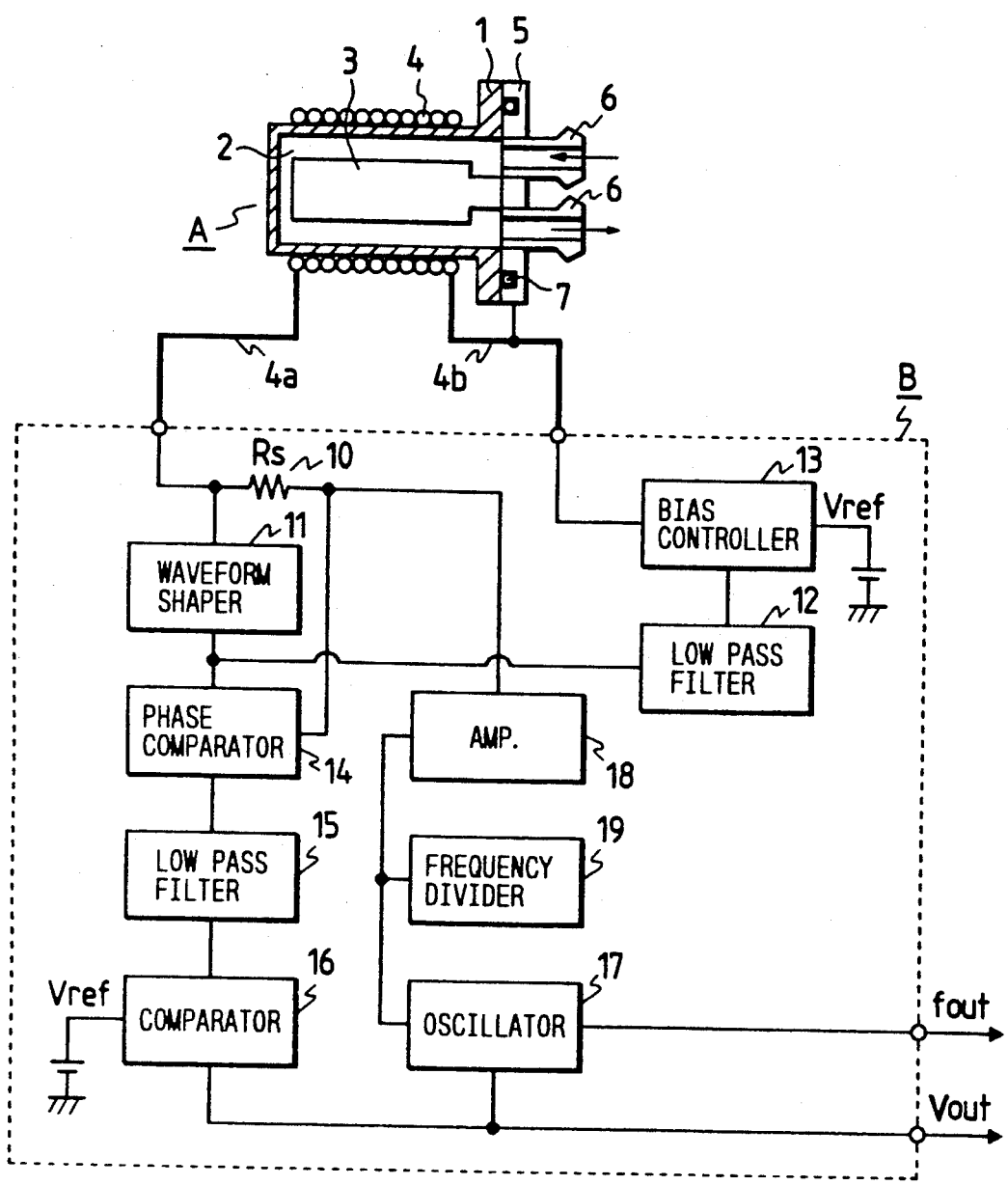
FIG. 1 is an explanatory diagram, partly as a block diagram, showing the arrangement of a fuel dielectric constant detecting apparatus, which constitutes a first embodiment of this invention.

The apparatus, as shown in FIG. 1, comprises: a sensor section A, and a detecting circuit section B. The sensor section A is the same section as the above-described conventional apparatus. The detecting circuit section B comprises: a waveform shaper 11 connected to the single layer coil 4 and a resistor 10; a low-pass filter 12 to which the output of the waveform shaper 11 is connected; bias control means 13 connected to the output of the low-pass filter 12 and to a predetermined reference voltage $V_{ref}$ which corresponds to the voltage which the low-pass filter 12 outputs when the duty of the output of the waveform shaper 11 is 50%, the bias control means 13 applying a DC level to the single layer coil 4 through the lead wire 4b; and a phase comparator 14 connected to the output of the waveform shaper 11 and to the connecting line between the resistor 10 and an amplifier 18. The other arrangements are the same as those in the above-described conventional apparatus.

Figure 2:
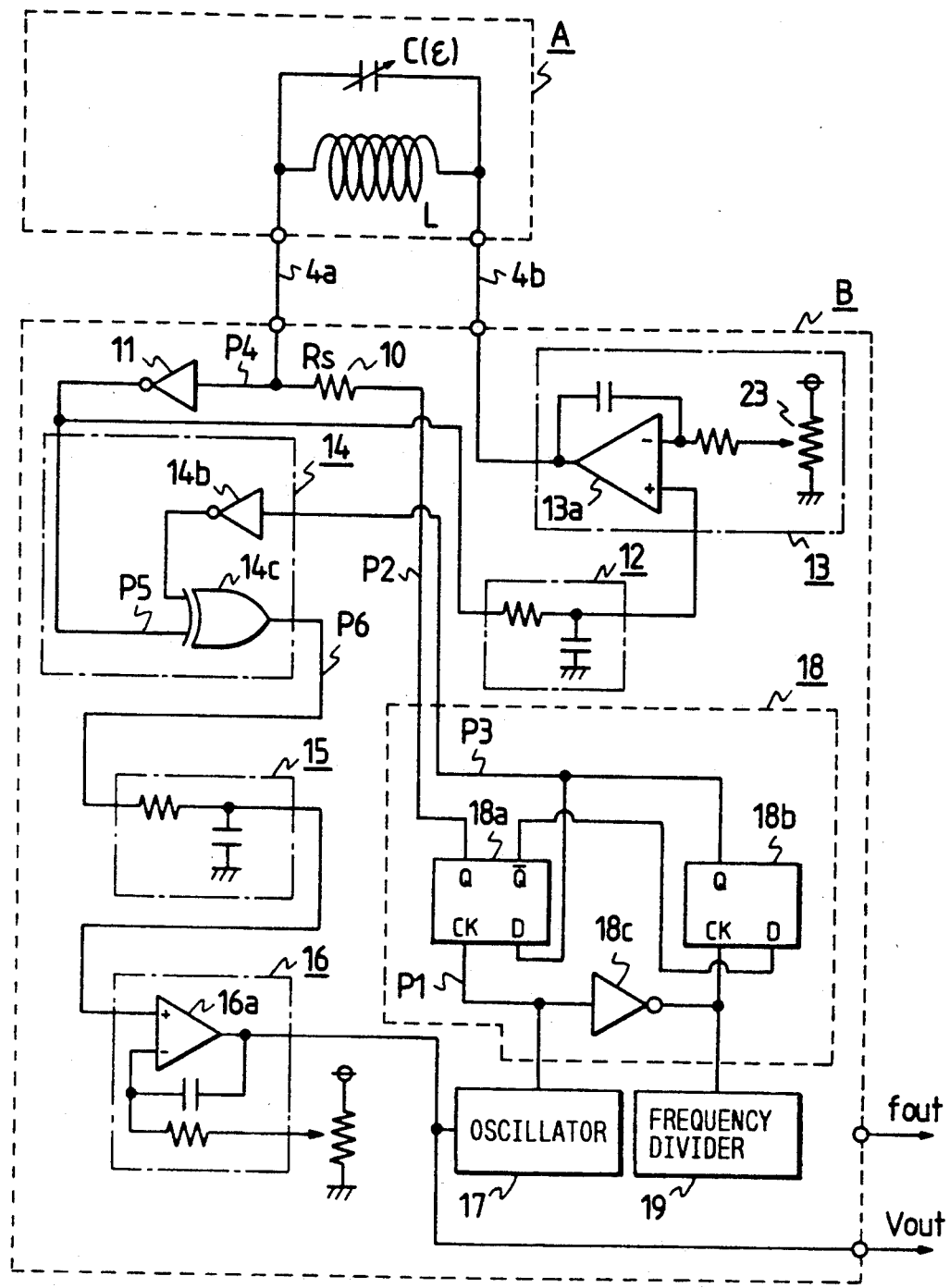
FIG. 2 is a circuit diagram, partly as a block diagram, showing the arrangement of the apparatus of the invention in detail.
Figure 3:
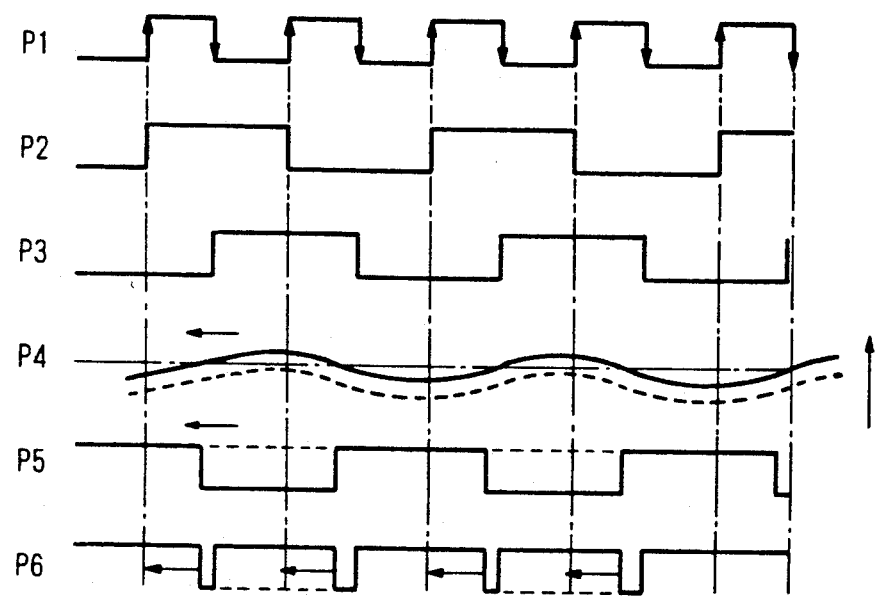
FIG. 3 is a time chart showing signals at various circuit points in FIG. 2.
Figure 4A:
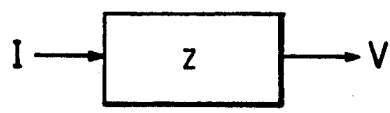
FIGS. 4(a) and 4(b) are equivalent circuit diagrams of a sensor section in a conventional fuel dielectric constant detecting apparatus.
Figure 4B:
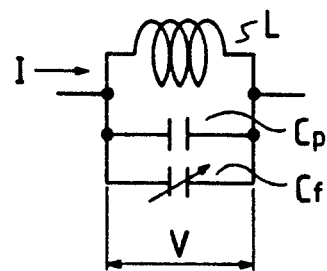
Figure 4C:
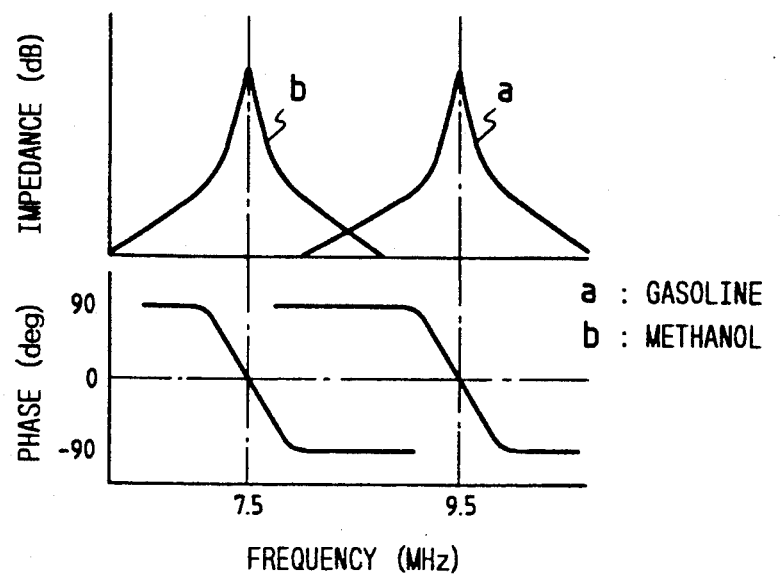
FIGS. 4(c) and 4(d) are frequency characteristic diagrams for a description of the operation of the conventional apparatus.
Figure 4D:
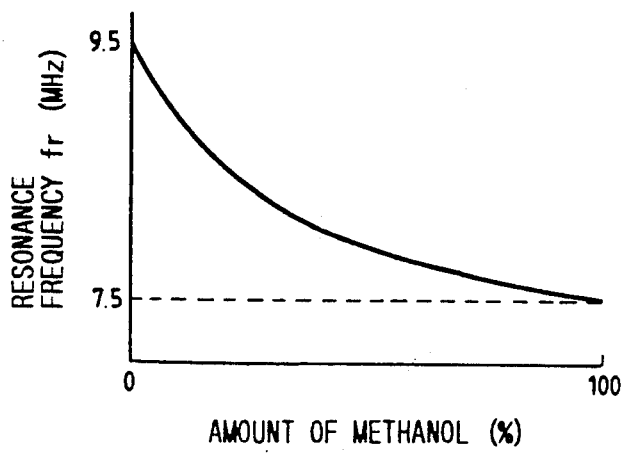
Figure 5:
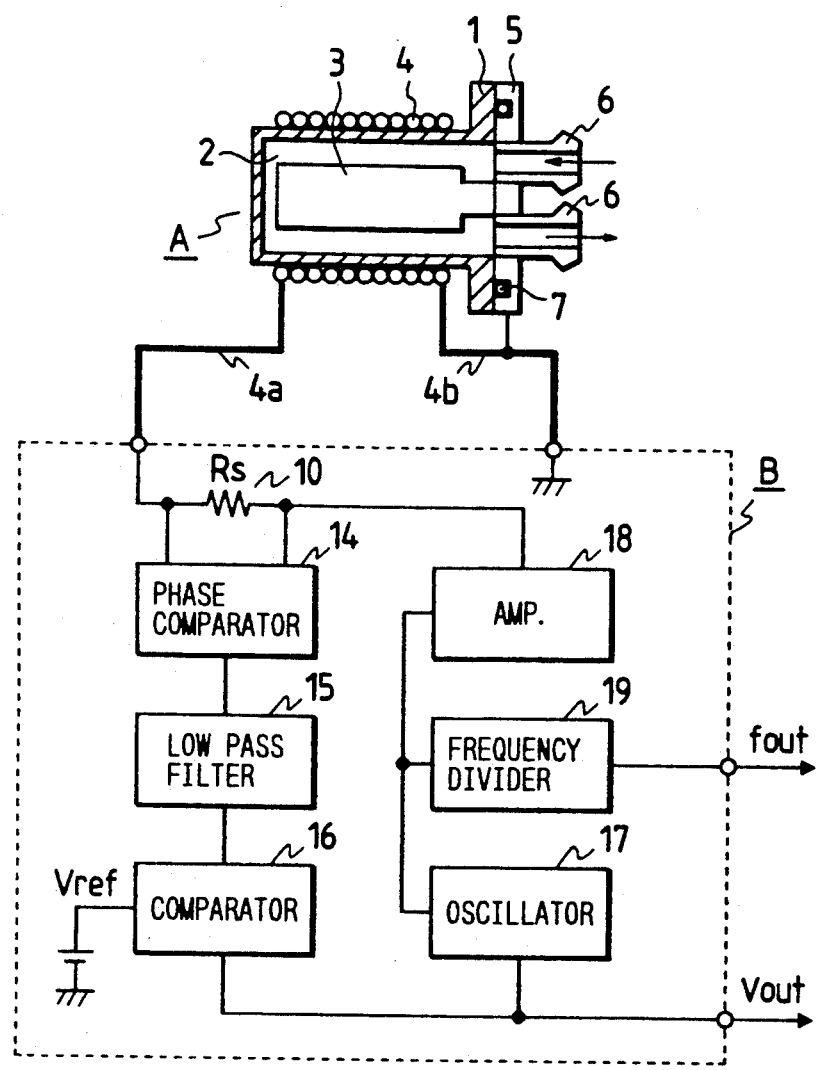
FIG. 5 is an explanatory diagram, partly as a block diagram, showing the arrangement of the conventional apparatus.

The above construction of the invention is shown in FIG. 2 in more detail. Similarly as in the case of FIG. 6, a phase synchronization loop is so formed that the phase shift between high frequency voltage signals at both ends of the resistor 10 be 0°. A larger part of FIG. 2 is in common with that of FIG. 6 (the prior art). Therefore, the apparatus of the invention will be described with respect mainly to its differences from the conventional apparatus. FIG. 3 shows the waveforms of signals at various circuit points in FIG. 2.

The high frequency square wave signal P1 outputted by the voltage-controlled oscillator 17 is applied to the CK port of the first D flip-flop circuit 18a, and it is further applied through the inverter 18c to the CK port of the second D flip-flop circuit 18b. The Q output P2 of the first D flip-flop circuit 18a is connected through the resistor 10 to the single layer coil 4. The Q output P3 of the second D flip-flop circuit 18b is a high frequency square wave which is shifted by 90° in phase from the signal P2.

The signal P4 provided at the connecting point of the resistor 10 and the single layer coil 4, which is applied to the latter 4, is shaped into a square wave by the waveform shaper 11 which is an inverter circuit, one of the logic circuits, made up of TTL or CMOS. The output of the waveform shaper 11 is switched to "H" and "L" levels as follows: That is, the output of the waveform shaper 11 is set to "L" level when the input is higher than the threshold level $V_{th}$; and it is raised to "H" level when smaller. The threshold level $V_{th}$ cannot be adjusted.

Figure 6:
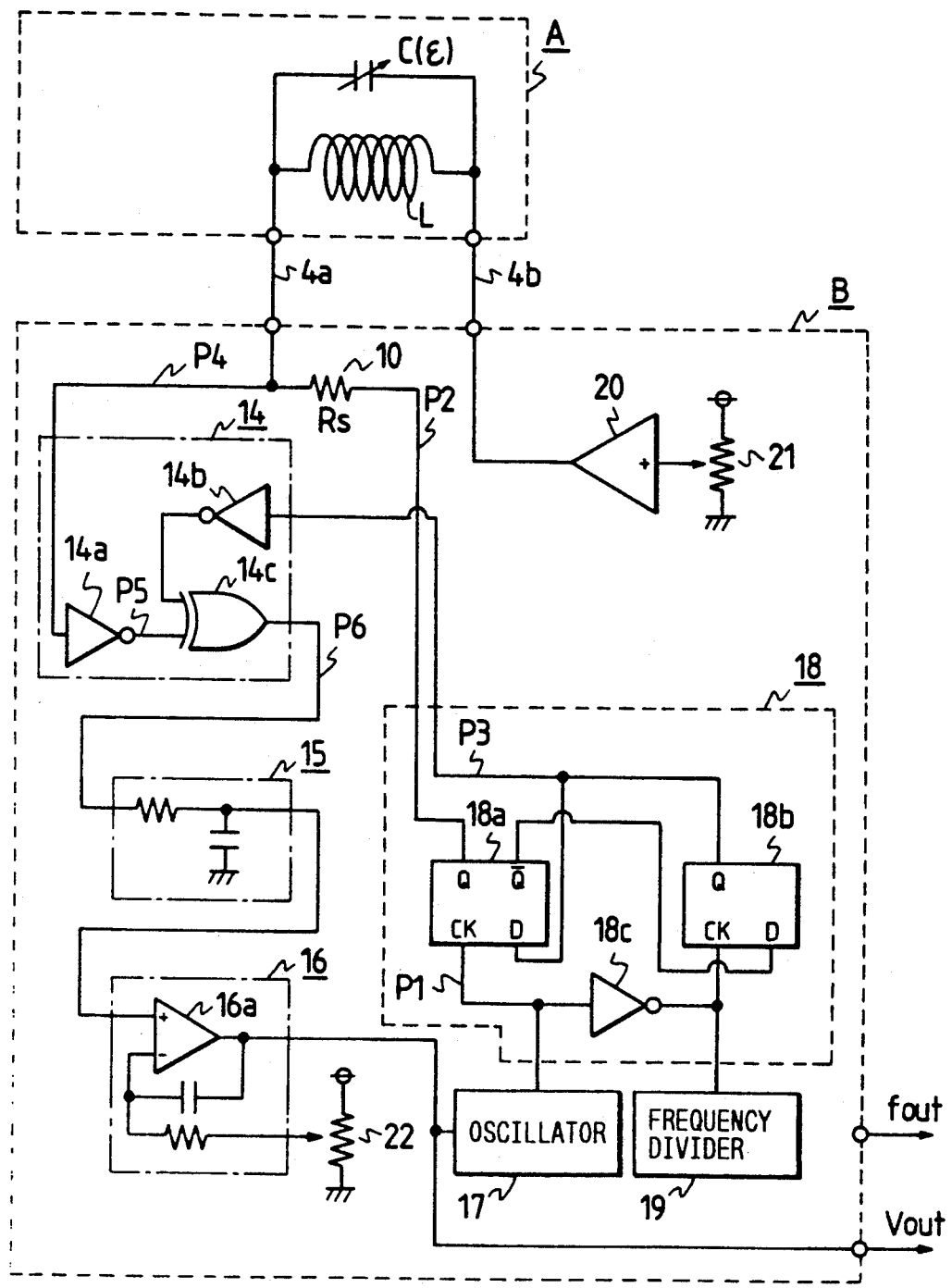
FIG. 6 is a circuit diagram, partly as a block diagram, showing the arrangement of the conventional apparatus in detail.

In the conventional fuel dielectric constant detecting apparatus as shown in FIG. 6, the voltage corresponding to the threshold level $V_{th}$ is supplied to the lead wire 4b of the single layer coil 4 as the DC component of the signal P4, to permit the waveform shaping operation. On the other hand, in the embodiment of the invention, the output of the waveform shaper 11 is converted into a DC voltage corresponding to its duty by the low-pass filter 12, and the difference between the output of the low-pass filter 12 and a voltage $V_{ref}$ corresponding to the voltage which the low-pass filter 12 outputs when the duty of the output of the waveform shaper 11 is 50%, is subjected to integration by a comparison integrator 13a in the bias control means 13. The resultant integration value is supplied to the lead wire 4b of the single layer coil 4.

For instance in the case where the signal P4 is as indicated by the dotted line in FIG. 3, the output P5 of the waveform shaper 11 is at "H" level at all times, and accordingly the output of the low-pass filter 12 is at "H" level at all times. This "H" level output is applied to the comparison integrator 13a. Therefore, the output of the bias control means 13 is increased, so that the DC level of the signal P4 is increased. Thus, the signal P4 is raised, finally to the level as indicated by the solid line.

The EXCLUSIVE OR circuit 14c in the phase comparator 14 is made up of TTL or CMOS. The signal P3 is applied through the inverter 14b to one of the input terminals of the EXCLUSIVE OR circuit 14vc, while the output P5 of the waveform shaper 11 is applied to the other input terminal, so that the signals P3 and P5 are subjected to comparison. When, in the sensor section A, the LC circuit is excited at a frequency other than the resonance frequency, the phase shift between the signals P5 and P2 is not 0°, and the phase shift between the signals P5 and P3 is not 90°, and therefore the duty of the output P6 of the EXCLUSIVE OR circuit 14c is not 50%.

Figure 7:
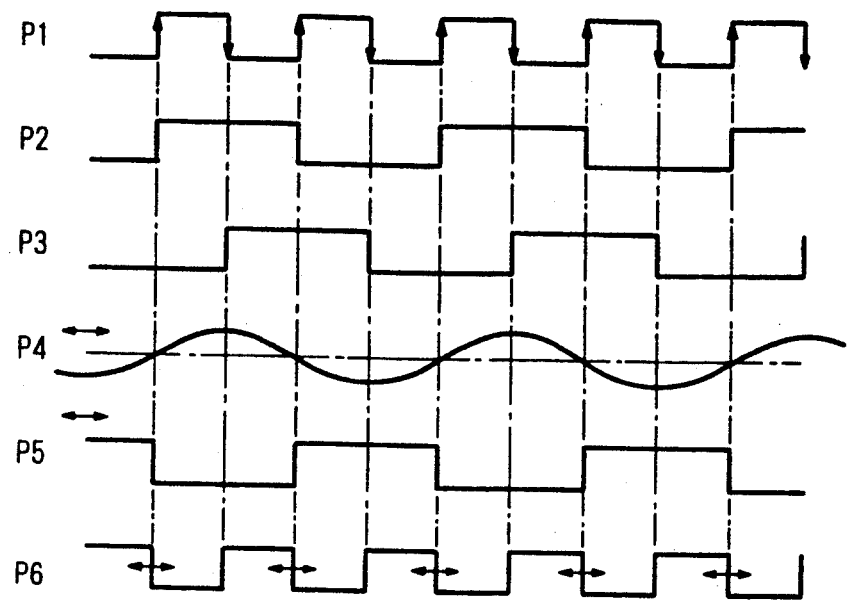
FIG. 7 is a time chart for a description of the operation of the conventional apparatus.
Figure 8:
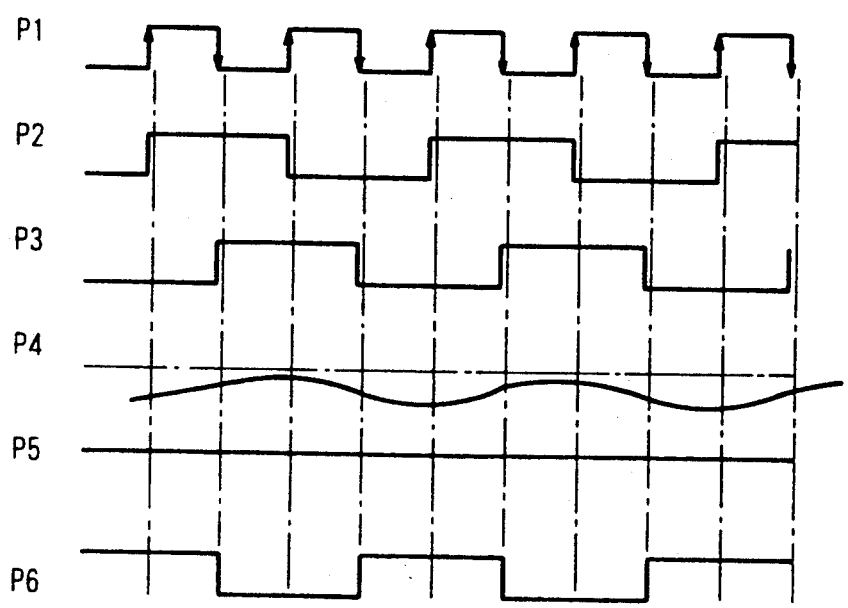
FIGS. 8 and 9 are diagrams for a description of output errors of the conventional apparatus.
Figure 9:
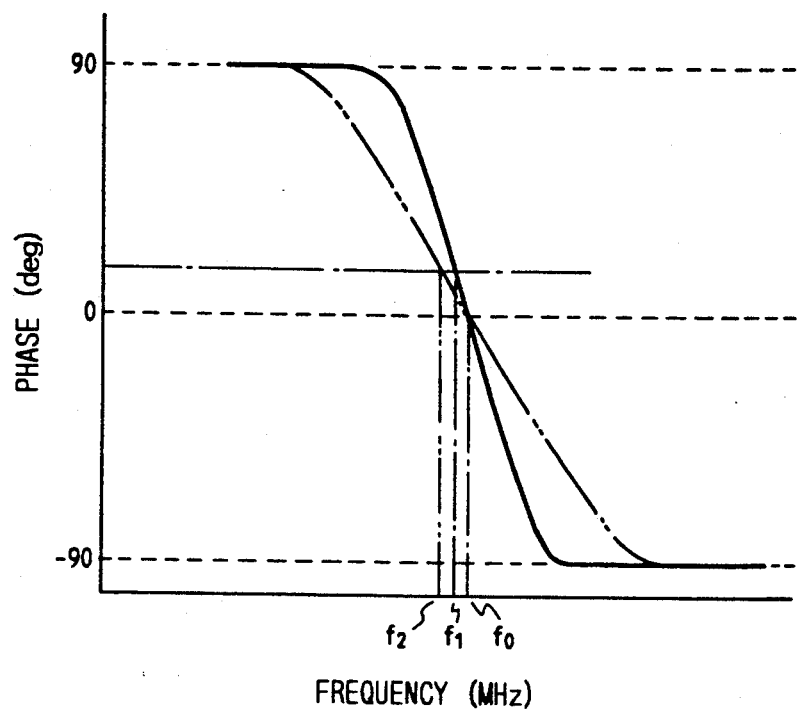

Therefore, when the signal P6 is applied to the low-pass filter 15, the DC output of the latter is applied to the comparison integrator 16, so that the difference between the DC output and the reference voltage $V_{ref}$ corresponding to the phase shift 0° is integrated, and the resultant integration value is applied to the voltage-controlled oscillator 17 to control the oscillation frequency. As a result, the phase of the signal P4 is shifted to left direction in FIG. 3, and accordingly the signal P6 is also changed as indicated by the arrows. Finally, phase feedback control is established as shown in FIG. 7.

In the above-described embodiment, the bias control means 13 obtains the voltage $V_{ref}$ corresponding to the duty of 50% by dividing the supply voltage with the variable resistor 23. However, any other signal having a duty of 50%, for instance the signal P2, may be applied to a low-pass filter equivalent in function to the low-pass filter 12, to obtain its DC voltage. In this case, the bias control means 13 controls the voltage supplied to the single layer coil so that the DC voltage be equal to the output voltage of the low-pass filter 12.

Another fuel dielectric constant detecting apparatus, a second embodiment of the invention, will be described with reference to FIG. 10.

Figure 10:
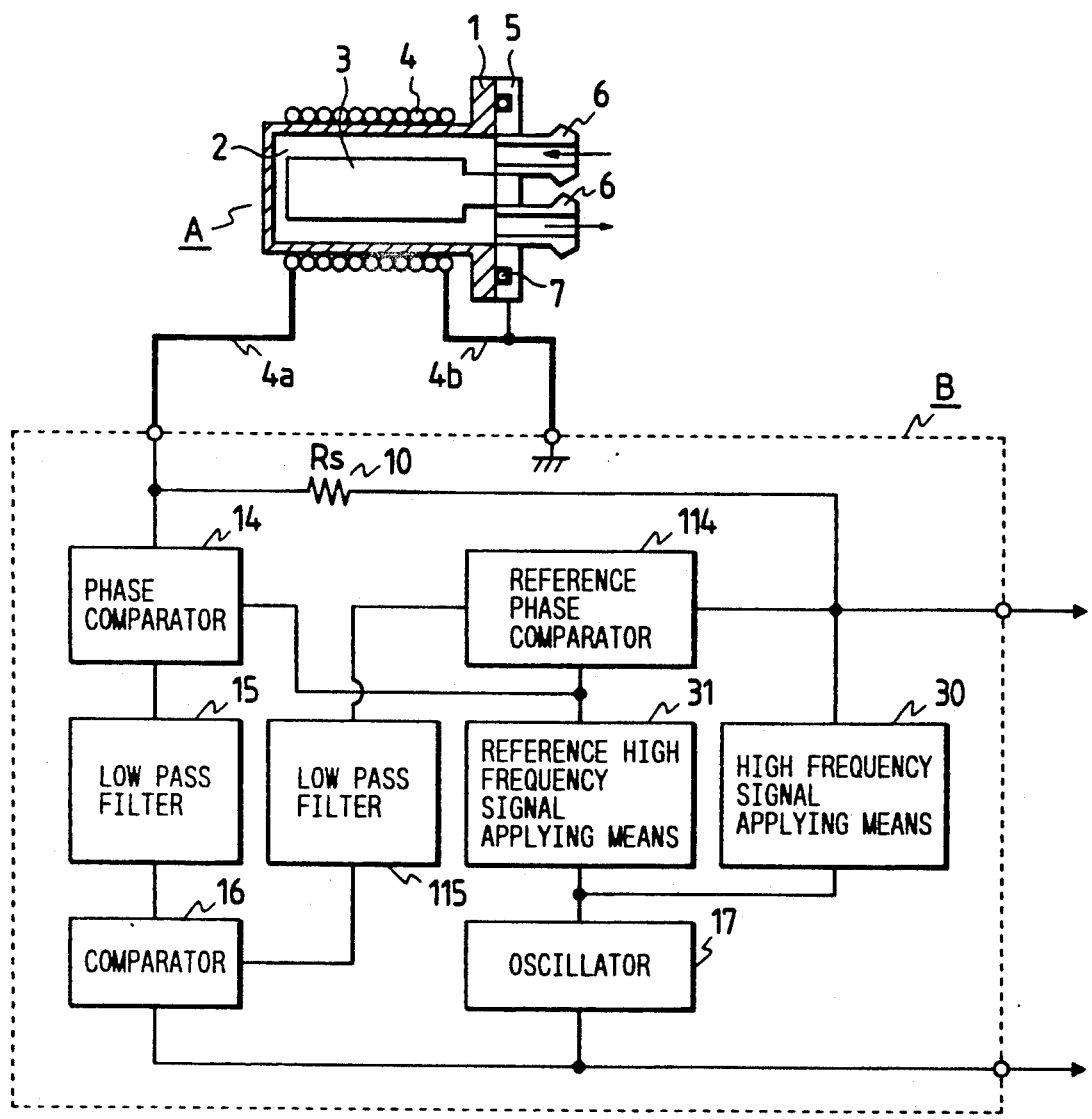
FIG. 10 is an explanatory diagram, k partly as a block diagram, showing the arrangement of another fuel dielectric constant detecting apparatus, which constitutes a second embodiment of this invention.

The dielectric constant detecting apparatus, as shown in FIG. 10, also comprises a sensor section A, and a detecting circuit section B. The sensor section A is completely the same as the sensor section A of the conventional dielectric constant detecting apparatus. The detecting circuit section B includes: a detecting high frequency applying means 30 for applying a high frequency signal to the single layer coil 4 through a resistor 10; reference high frequency generating means 31 for outputting a reference high frequency signal which is equal in frequency to the output of the detecting high frequency applying means 30 and is shifted by a predetermined angle in phase from the latter; a detecting phase comparator 14 for detecting the phase shift between a signal provided in the connecting line of the resistor 10 and the single layer coil 4 and the output of the reference high frequency generating means 31; a reference phase comparator 114 for detecting the phase shift between the output of the detecting high frequency applying means 30 and the output of the reference high frequency generating means 31; a second low-pass filter 115 to which the output of the reference phase comparator 114 is applied; a comparison integrator 16 to which the output of a first low-pass filter 15 and the output of the second low-pass filter 115 are applied; and a voltage-controlled oscillator 17 which receives the output of the comparison integrator 30 and provides an output which is applied to the detecting high frequency applying signal 30 and the reference high frequency generating means 31.

Figure 12:
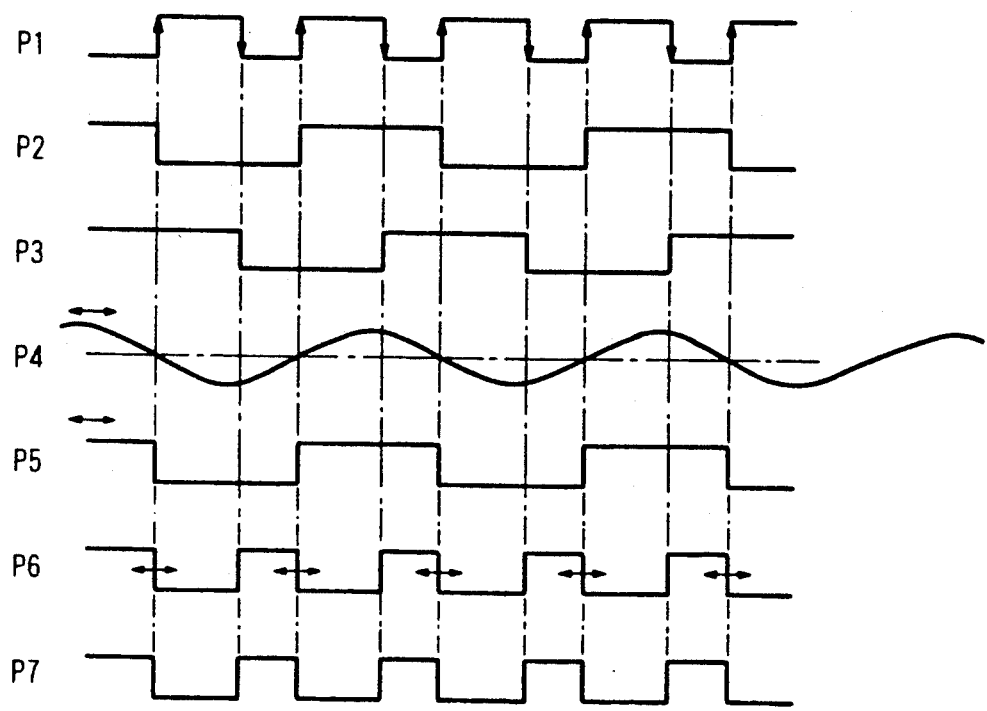
FIG. 12 is a time chart for a description of the operation of the apparatus shown in FIG. 11.
Figure 11:
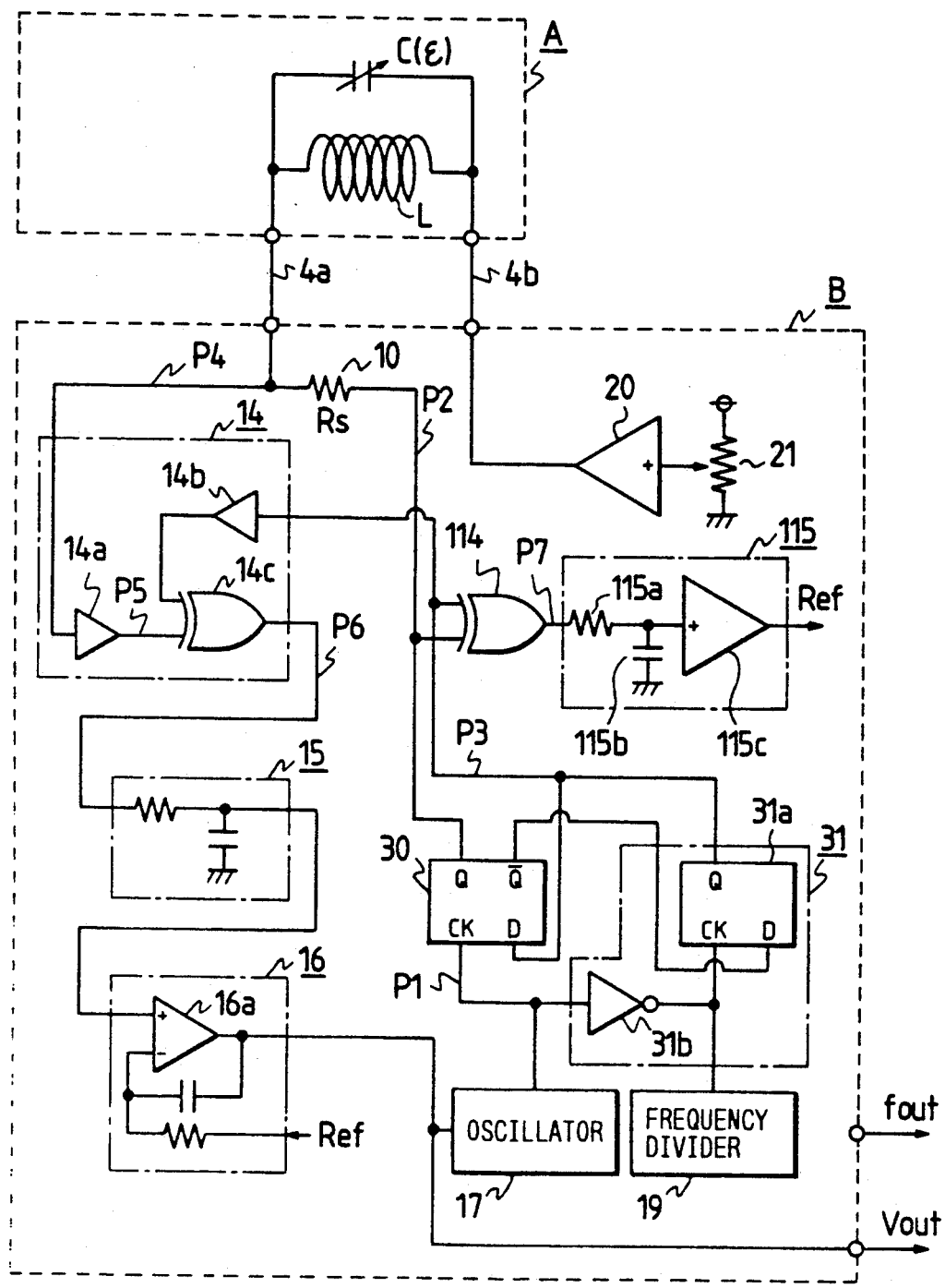
FIG. 11 is a circuit diagram, partly as a block diagram, showing the arrangement of the second embodiment of the invention in detail.

The arrangement of the dielectric constant detecting apparatus is shown in FIG. 11 in more detail. In the apparatus, similarly as in the conventional apparatus, a phase synchronization loop is so formed that the phase shift between high frequency voltages signals provided at both ends of the resistor 10 be 0°. FIG. 12 shows signals at various circuit points in FIG. 11.

Now, the operation of the apparatus will be described; however, parts of the apparatus different from those of the conventional apparatus would be mainly described.

The voltage-controlled oscillator 17 outputs a high frequency square wave signal P1, which is applied to the CK port of a first D flip-flop circuit 30. The signal P1 is further applied through an inverter 31b to the CK port of a second D flip-flop circuit 31a. The Q output P2 of the first D flip-flop circuit 30 is applied through the resistor 10 to the single layer coil 4. The Q output P3 of the second D flip-flop circuit 31a is a high frequency square wave which is shifted by an angle in phase from the signal P2 which is determined from the duty of the square wave signal P1; that is, the signals P2 and P3 have the phase shift therebetween which is determined from the duty of the signal P1.

The D flip-flops 30 and 31a and the inverter 31b operate in the same way as those 18a, 18b and 18c in FIG. 6. However, in the embodiment, in order to explain their functions more clearly, the first D flip-flop circuit 30 is named "detecting high frequency applying means", and the second D flip-flop circuit 31a and the inverter 31b, "reference high frequency generating means".

The signals P2 and P3 are applied to a phase comparator, namely, an EXCLUSIVE OR circuit 114, which outputs a square wave signal P7 having a duty corresponding to the phase shift between the signals P2 and P3. The signal P7 is applied to the second low-pass filter 115, where high frequency components are removed from the signal P7 by a resistor 115a and a capacitor 115b; that is, the signal P7 is converted into a DC voltage corresponding to the duty of the signal P7. The DC voltage is applied to a DC buffer 115, which outputs a DC voltage signal $R_{ef}$ corresponding to the phase shift between the signals P2 and P3.

The signal P3 is applied through a buffer circuit 14b to one input terminal of an EXCLUSIVE OR circuit 14c, one of the logic circuits such as TTL and MOS, in the detecting phase comparator 14, while a signal P4 at the connecting point of the resistor 10 and the single layer coil 4, which is applied to the single layer coil 4, is applied through a buffer circuit 14a to the other input terminal of the EXCLUSIVE OR circuit 14c, so that the signals P3 and P4 are subjected to phase comparison.

The high frequency signal P4 provided at the connecting point of the resistor 10 and the single layer coil 4 is sinusoidal. The buffer circuit 14a shapes the waveform of the signal P4, to provide a signal P5. The signal P5 is a square wave which is in phase with the signal P2 at the resonance frequency of the LC circuit of the sensor section A, and is shifted in phase from the signal P3 as much as the phase shift between the signals P2 and P3. Hence, when the phase shift between the signals P2 and P4 provided at both ends of the resistor 10 is 0°; i.e., when the frequency is the resonance frequency of the LC circuit in the sensor section A, the output signal P6 of the EXCLUSIVE OR circuit 14c is a square wave which has the same duty as the signal P7.

The output signal P6 of the EXCLUSIVE OR circuit 14c is applied to the low-pass filter 15, the DC output of which is supplied to the comparison integrator 16, where the difference between the DC output and the output voltage $R_{ef}$ of the low-pass filter 15 is subjected to integration. The resultant integration value; i.e., the output of the comparison integrator 16 is applied to the voltage-controlled oscillator 17, to control the oscillation frequency of the latter 17. That is, a phase synchronization loop is formed which controls the output frequency of the voltage-controlled oscillator 17 so that the phase shift between the high frequency voltages signals provided at both ends of the resistor 10 be 0°.

Let us consider the case when the supply voltage applied to the detecting circuit section B changes. In this case, the high levels of the EXCLUSIVE OR circuits 14c and 114 also change, and therefore the DC voltage is also changed which corresponds to the phase shift which is obtained by applying the outputs of the EXCLUSIVE OR circuits 14c and 114 to the respective low-pass filters 15 and 115. However, the two EXCLUSIVE OR circuits 14c and 114 are equal in arrangement to each other, and therefore, with the same supply voltage, the high levels outputted by them are equal to each other. Hence, with the same duty, the DC voltages outputted through the low-pass filters 15 and 115 are equal to each other.

Thus, in the above-described case, the signals P6 and P7 are equal in duty, and the phase shift between the signals P2 and P3 is equal to the phase shift between the signals P3 and P5. In conclusion, the phase shift between the high frequency signals provided at both ends of the resistor 10 is so controlled to be 0° at all times. On the other hand, even in manufacturing the fuel dielectric constant detecting apparatus on large scale, the phase shift between the high frequency signals provided at both ends of the resistor 10 is so controlled to be 0° at all times, because no matter what duty is when the voltage-controlled oscillator 17 oscillates, the oscillation frequency is so controlled that the signals P6 and P7 have one and the same duty.

In the above-described first and second embodiments, the content of methanol in a methanol-mixed gasoline is detected. However, it goes without saying that the apparatus can be used for detection of the dielectric constants of other liquids.

As was described above, in the first embodiment of the invention, the phase shift between the voltages provided at both ends of the resistor connected in series to the detecting coil is detected, and the output frequency of the high frequency applying means adapted to apply the high frequency signal to the detecting coil through the resistor is controlled. In the detection of the phase shift, the voltage at the connecting point of the resistor and the detecting coil is waveform-shaped into a square wave by the waveform shaper, and the DC voltage is applied to the detecting coil so that the duty of the square wave be the predetermined value; that is, the duty of the output of the waveform shaper is controlled to the predetermined value. Even when the fuel dielectric constant changes so abruptly that the phase synchronization loop becomes unsatisfactory in control, and the detection of the phase shift is therefore incorrect, the control is quickly restored normal. Thus, with the apparatus of the invention, the fuel dielectric constant can be detected with high accuracy. Furthermore, the apparatus of the invention is suitable for mass production, because it is free from the difficulty that the DC voltage applied to the detecting coil must be adjusted in accordance with the characteristic of the waveform shaper.

In the apparatus according to the second embodiment, the output frequencies of the high frequency applying means and the reference frequency generating means are feedback-controlled so that the phase shift between the high frequency signal provided by the detecting coil and the reference high frequency signal be equal to the phase shift between the reference high frequency signal and the high frequency applied to the detecting coil through the resistor. Therefore, in the apparatus, the phase synchronization loop formed operates to set the phase shift between the signals provided at both ends of the resistor to 0° irrespective of the change in the phase shift between the outputs of the high frequency applying means and the reference high frequency generating means or the change in the output of the phase comparator which is due to the change in supply voltage. Thus, the apparatus of the invention can detect the fuel dielectric constant with high accuracy being free from the change in quality factor Q of the detecting coil due to the change in dielectric constant of the fuel, or the change in supply voltage. Furthermore, in manufacturing the apparatuses on large scale, it is unnecessary to adjust the phase synchronization loop in each apparatus; that is, the apparatus is suitable for mass production as much.

While there has been described in connection with the preferred embodiment of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. An apparatus for detecting dielectric constant of a fuel, said apparatus comprising:
   means for applying a high frequency voltage signal;
   means for subjecting the high frequency voltage signal from said applying means to resonance corresponding to the dielectric constant of the fuel;
   a resistor having one end connected in series to said subjecting means and the other end to which the high frequency voltage signal is applied from said applying means;
   bias control means connected to the other terminal of said subjecting means for applying a bias DC voltage to said subjecting means;
   detecting means connected between said one and the other ends of said resistor for detecting a phase shift between said high frequency voltage signal of said applying means and a voltage signal provided in a connecting line between said subjecting means and said resistor;
   control means for controlling the high frequency voltage signal from said applying means to adjust the phase shift detected by said detecting means to a first predetermined value, at least one of said applying means and control means producing a signal representative of the dielectric constant of the fuel.

2. An apparatus according to claim 1, wherein said detecting means includes waveform shaping means to convert said voltage signal in a sinusoidal waveform provided in the connecting line between said subjecting means and said resistor to a corresponding square waveform signal, and said detecting means compares the square waveform signal from said waveform shaping means with the high frequency voltage signal of said applying means in a square waveform.

3. An apparatus according to claim 2, wherein said bias control means includes converting means for converting said square waveform signal from said waveform shaping means to a direct current voltage signal representative of a duty thereof, said bias control means adjusting said bias DC voltage to cause the voltage signal representative of the duty to become second predetermined value.

4. An apparatus according to claim 1, wherein said first predetermined value of the phase shift is 0 degree.

5. An apparatus according to claim 3, wherein said second predetermined value represent a duty 50%.

6. An apparatus according to claim 1, wherein said applying means including a section for applying a high frequency voltage signal to said resistor and a section for applying a reference high frequency voltage signal to said detecting means to be compared with said voltage signal provided in the connecting line between said subjecting means and said resistor.

7. An apparatus according to claim 6, further comprising reference phase comparing means for detecting a reference phase shift between the output of said high frequency signal applying section with the output of said reference high frequency signal applying section, wherein said control means controls the high frequency voltage signal from said applying means to adjust the phase shift detected by said detecting means to the reference phase shift detected by said reference phase comparing means as the first predetermined value, at least one of the output frequency of said high frequency applying section, the output frequency of said reference high frequency applying section and the control output of said control means producing a signal representative of the dielectric constant of said fuel.

8. An apparatus according to claim 1, wherein said fuel includes at least one of gasoline and alcohol.

* * * * *